United States Patent
Lee et al.

(10) Patent No.: US 8,463,572 B2
(45) Date of Patent: Jun. 11, 2013

(54) SEMICONDUCTOR DEVICE

(75) Inventors: Sang Kwon Lee, Seoul (KR); Bong Seok Han, Cheongju-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 13/233,894

(22) Filed: Sep. 15, 2011

(65) Prior Publication Data

US 2012/0013357 A1 Jan. 19, 2012

Related U.S. Application Data

(62) Division of application No. 12/004,786, filed on Dec. 20, 2007, now Pat. No. 8,041,531.

(30) Foreign Application Priority Data

May 21, 2007 (KR) .................. 10-2007-0049357

(51) Int. Cl.
*G01R 31/10* (2006.01)

(52) U.S. Cl.
USPC ............................................... 702/120

(58) Field of Classification Search
USPC ............................................... 702/120
See application file for complete search history.

(56) References Cited

U.S. PATENT DOCUMENTS

| 7,050,342 | B2 | 5/2006 | Gans et al. |
| 2005/0007172 | A1* | 1/2005 | Sadakata et al. ............ 327/202 |
| 2007/0076495 | A1 | 4/2007 | Mochida et al. |

FOREIGN PATENT DOCUMENTS

| KR | 10-0265138 B1 | 6/2000 |
| KR | 10-2000-0065784 A | 11/2000 |
| KR | 10-2005-0067493 A | 7/2005 |

* cited by examiner

*Primary Examiner* — Tung S Lau
(74) *Attorney, Agent, or Firm* — John P. White; Cooper & Dunham LLP

(57) ABSTRACT

A semiconductor device comprises a burn-in test circuit configured to receive a flag signal for a burn-in test, generate a toggled output enable signal, and drive a first input/output line to toggle a signal on the first input/output line, and a switching device connected between a bit line and a second input/output line for transferring a signal on the bit line to the second input/output line in response to the output enable signal.

15 Claims, 15 Drawing Sheets

SEMICONDUCTOR DEVICE

CROSS REFERENCE TO RELATED APPLICATIONS

This application is a divisional of U.S. application Ser. No. 12/004,786, filed Dec. 20, 2007, now U.S. Pat. No. 8,041,531 claiming priority to Korean application numbers 10-2007-0049357, filed on May 21, 2007.

BACKGROUND

In a dynamic random access memory (DRAM), in order to shorten a test time and guarantee the operation of a device over several years, a burn-in test is carried out by applying abrupt stress to the device. Such conventional burn-in tests have employed schemes for screening defects in advance by applying stress mainly to Oxide-Nitride-Oxide (ONO) films, cells and bit lines. These screening schemes may include, for example, a scheme for applying stress to an ONO film by applying a high voltage to a word line, writing high-voltage data into a cell using a bit line precharge voltage VBLP and then grounding a VCP voltage, and a scheme for applying stress between adjacent cells or adjacent bit lines by applying voltages of different polarities to the adjacent cells or adjacent bit lines to impress a high voltage therebetween.

Referring to FIG. 15, a semiconductor device comprises an output switch 150 including n-channel metal oxide semiconductor (NMOS) transistors N159 and N160 connected respectively between bit lines BL and BLB and segment input/output lines SIO and SIOB, for transferring data placed on the bit lines BL and BLB to the segment input/output lines SIO and SIOB in response to an output enable signal Yi. The output switch 150 has a single contact because it is small in layout area. However, if at least one of the contacts of such output switches has an initial defect, the quality of a product and the package yield thereof will be degraded, thus adversely affecting reliability of the device. Therefore, there is a need to screen a contact defect of the output switch 150 in advance.

SUMMARY

This disclosure describes improved approaches for performing a burn-in test. In an aspect of the present disclosure, a semiconductor device comprises a burn-in test circuit configured to receive a flag signal for a burn-in test, generate a toggled output enable signal, and drive a first input/output line to toggle a signal on the first input/output line, and a switching device connected between a bit line and a second input/output line for transferring a signal on the bit line to the second input/output line in response to the output enable signal. The first input/output line may be a global input/output line. The second input/output line may be a segment input/output line.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION OF EXEMPLARY EMBODIMENTS

Figure 1:
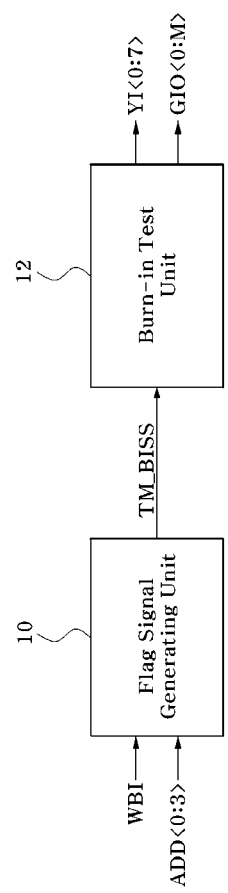
FIG. 1 is a block diagram showing the configuration of a burn-in test apparatus according to an exemplary embodiment of the present disclosure.

FIG. 1 is a block diagram showing the configuration of a burn-in test apparatus, according to an exemplary embodiment of the present invention.

As shown in FIG. 1, the burn-in test apparatus according to this exemplary embodiment comprises a flag signal generating unit 10 and a burn-in test unit 12. The flag signal generating unit 10 acts to receive an external input signal WBI and first to fourth external address signals ADD<0:3> and generate a flag signal TM_BISS. The burn-in test unit 12 acts to receive the flag signal TM_BISS, generate first to eighth toggled output enable signals YI<0:7>, and drive a global input/output line GIO<0:M> to toggle a signal on the global input/output line GIO<0:M>. Here, the external input signal WBI is a signal externally inputted for execution of a burn-in test.

Figure 2:
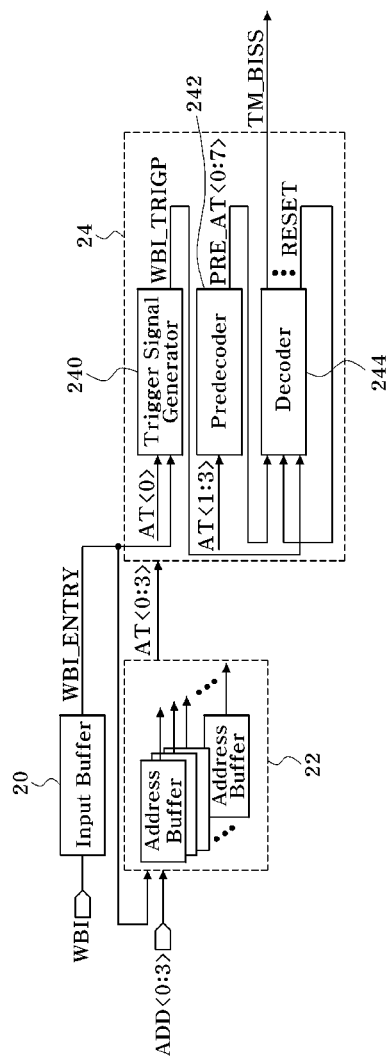
FIG. 2 is a block diagram showing the configuration of a flag signal generating unit in FIG. 1.

The flag signal generating unit 10 includes, as shown in FIG. 2, an input buffer 20 for buffering the external input signal WBI to generate an internal signal WBI_ENTRY, a plurality of address buffers 22 for buffering the first to fourth external address signals ADD<0:3> in response to the internal signal WBI_ENTRY to generate first to fourth internal address signals AT<0:3>, respectively, and a signal generator 24 configured to receive the internal signal WBI_ENTRY and the first to fourth internal address signals AT<0:3> and generate the flag signal TM_BISS. The signal generator 24 includes a trigger signal generator 240 for generating a trigger signal WBI_TRIGP in response to the internal signal WBI_ENTRY and the first internal address signal AT<0>, a first predecoder 242 configured to receive the second to fourth internal address signals AT<1:3> and generate first to eighth predecoded signals PRE_AT<0:7>, and a first decoder 244 for generating the flag signal TM_BISS in response to the trigger signal WBI_TRIGP and the first to eighth predecoded signals PRE_AT<0:7>.

Figure 3:
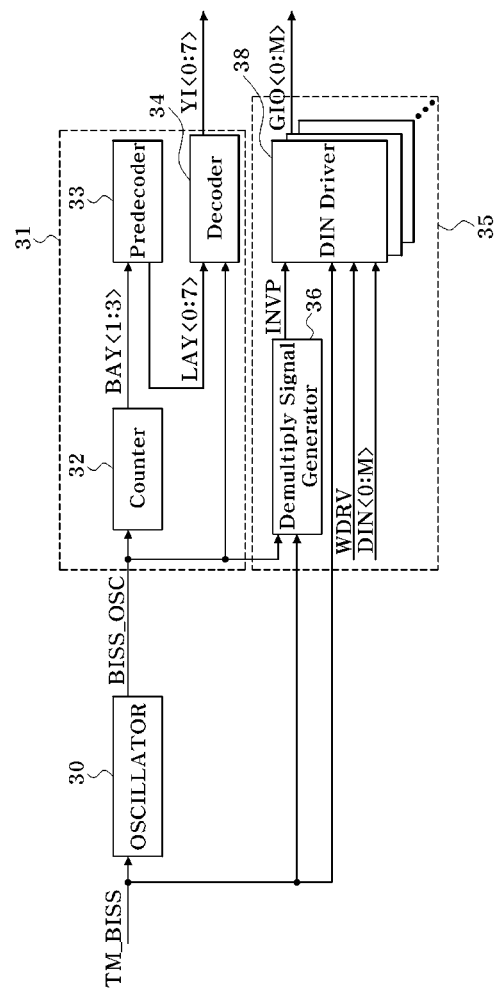
FIG. 3 is a block diagram showing the configuration of a burn-in test unit in FIG. 1.

The burn-in test unit 12 includes, as shown in FIG. 3, an oscillator 30 for generating a pulse signal BISS_OSC in response to the flag signal TM_BISS, an output enable signal generator 31 for generating the first to eighth output enable signals YI<0:7> in response to the pulse signal BISS_OSC, and an input/output line driver 35 configured to receive the flag signal TM_BISS and the pulse signal BISS_OSC and drive the global input/output line GIO<0:M>. The output enable signal generator 31 includes a counter 32 for generating first to third count signals BAY<1:3> in response to the pulse signal BISS_OSC, a second predecoder 33 for predecoding the first to third count signals BAY<1:3> to generate first to eighth decoded output signals LAY<0:7>, and a second decoder 34 configured to receive the pulse signal BISS_OSC and the first to eighth decoded output signals LAY<0:7> and generate the first to eighth output enable signals YI<0:7>. The input/output line driver 35 includes a demultiply signal generator 36 configured to receive the pulse signal BISS_OSC and generate a demultiply signal INVP, which is a ÷2 signal of the pulse signal BISS_OSC, in response to the flag signal TM_BISS, and a data driver 38 for driving the input/output line GIO<0:M> in response to the flag signal TM_BISS and the demultiply signal INVP.

Figure 4:
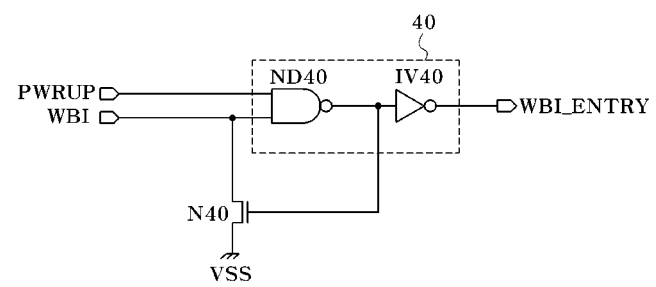
FIG. 4 is a circuit diagram of an input buffer in FIG. 2.

The input buffer 20 includes, as shown in FIG. 4, a first logic circuit 40 for performing an AND operation with respect to a power-up signal PWRUP which makes a low to high level transition upon application of power and the external input signal WBI to generate the internal signal WBI_ENTRY. Here, the first logic circuit 40 is composed of a NAND gate ND40 and an inverter IV40. The input buffer 20 further includes an NMOS transistor N40 for driving an external input signal WBI input terminal to a low level in response to an output signal from the NAND gate ND40. Because the external input signal WBI is required for only a test in a wafer state, such as the burn-in test, a pad (not shown) to which the external input signal WBI is inputted enters a floating state in a package state. However, before power is applied, the NMOS transistor N40 is turned on by the power-up signal PWRUP of a low level, so that the pad to which the external input signal WBI is inputted assumes a low level.

Figure 5:
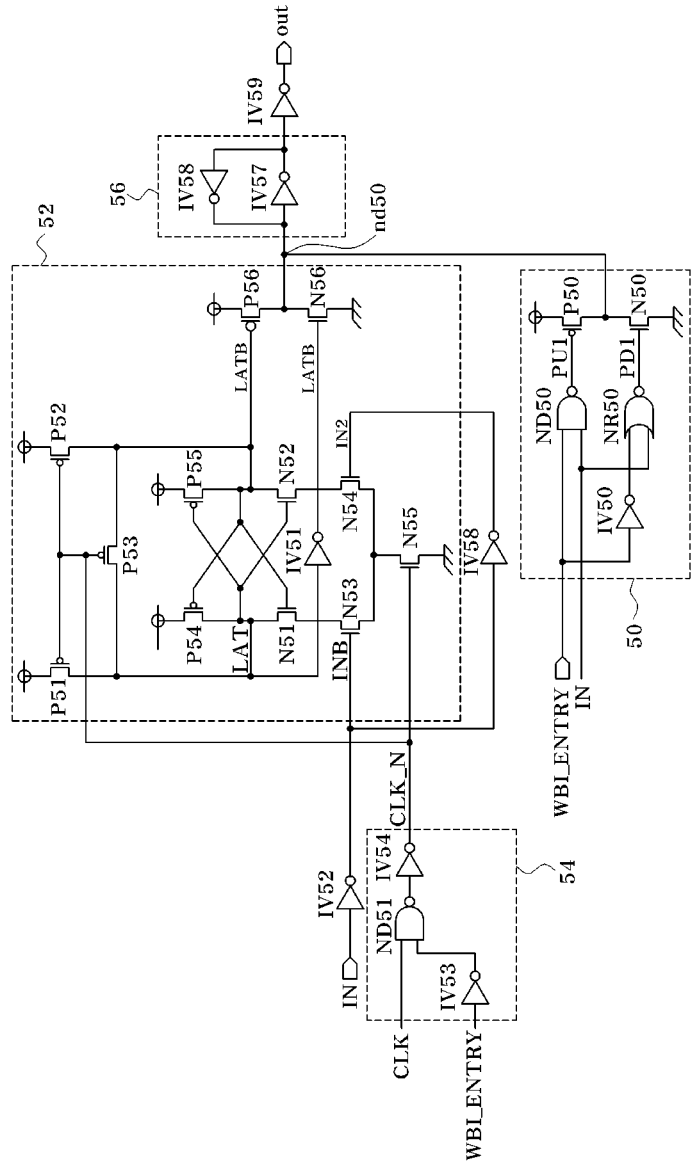
FIG. 5 is a circuit diagram of an address buffer in FIG. 2.

Each address buffer 22 includes, as shown in FIG. 5, a bypass circuit 50, a differential amplifier 52, a clock signal generator 54, and a first latch 56. The differential amplifier 52 is implemented with a general differential amplification circuit, and a detailed description of the configuration thereof will thus be omitted. The bypass circuit 50 includes a NAND gate ND50 for performing a NAND operation with respect to the internal signal WBI_ENTRY and a corresponding one of the first to fourth external address signals ADD<0:3>, inputted through an input terminal IN, to generate a first pull-up signal PU1, a NOR gate NR50 for performing a NOR operation with respect to an inverted signal of the internal signal WBI_ENTRY and a corresponding one of the first to fourth external address signals ADD<0:3> inputted through the input terminal IN to generate a first pull-down signal PD1, a p-channel metal oxide semiconductor (PMOS) transistor P50 for pulling a node nd50 up in response to the first pull-up signal PU1, and an NMOS transistor N50 for pulling the node nd50 down in response to the first pull-down signal PD1. The clock signal generator 54 acts to perform an AND operation with respect to a first clock signal CLK and an inverted signal of the internal signal WBI_ENTRY to generate a second clock signal CLK_N. To this end, the clock signal generator 54 includes a NAND gate ND51 and an inverter IV54.

Figure 6:
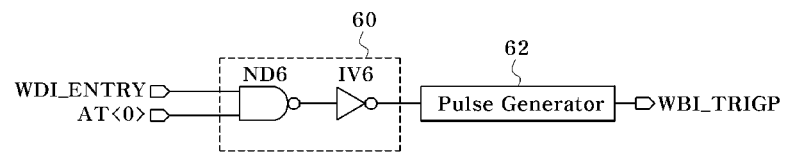
FIG. 6 is a circuit diagram of a trigger signal generator in FIG. 2.

The trigger signal generator 240 includes, as shown in FIG. 6, a second logic circuit 60 for performing an AND operation with respect to the internal signal WBI_ENTRY and the first internal address signal AT<0>, and a pulse generator 62 for generating the trigger signal WBI_TRIGP in response to an output signal from the second logic circuit 60. Here, the second logic circuit 60 is composed of a NAND gate ND6 and an inverter IV6.

Figure 7:
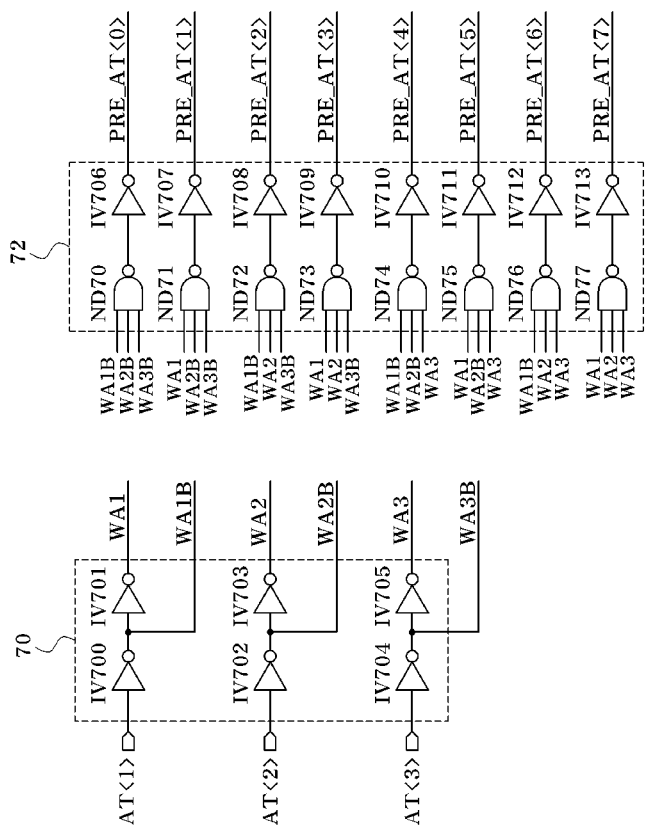
FIG. 7 is a circuit diagram of a first predecoder in FIG. 2.

The first predecoder 242 includes, as shown in FIG. 7, a first control signal generator 70 for buffering the second to fourth internal address signals AT<1:3> to generate respective first to third control signals WA1, WA2 and WA3 and respective first to third inverted control signals WA1B, WA2B and WA3B, and a first predecoded signal generator 72 for generating the first to eighth predecoded signals PRE_AT<0:7> in response to the first to third control signals WA1, WA2 and WA3 and the first to third inverted control signals WA1B, WA2B and WA3B.

Figure 8:
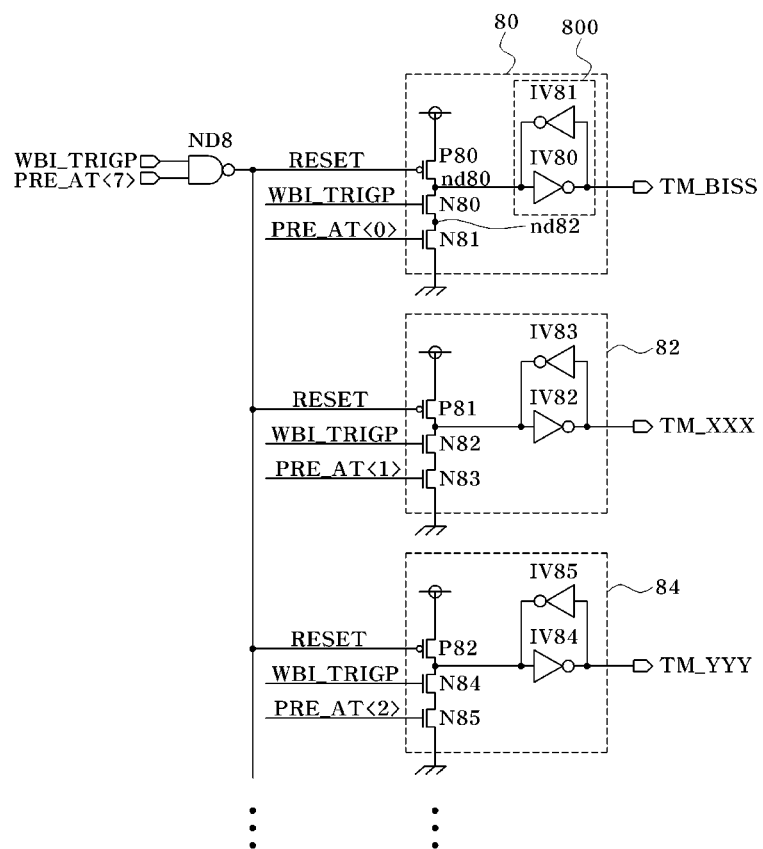
FIG. 8 is a circuit diagram of a first decoder in FIG. 2.

The first decoder 244 includes, as shown in FIG. 8, a NAND gate ND8 for performing a NAND operation with respect to the trigger signal WBI_TRIGP and the eighth predecoded signal PRE_AT<7> to generate a reset signal RESET, and a first flag signal generator 80 for generating the flag signal TM_BISS. Second and third flag signal generators 82 and 84 are provided to generate flag signals TM_XXX and TM_YYY which are enabled for execution of tests of purposes different from that of the present embodiment, respectively. The first flag signal generator 80 includes a PMOS transistor P80 for pulling a node nd80 up in response to the reset signal RESET, NMOS transistors N80 and N81 connected in series between the node nd80 and a ground voltage terminal VSS for pulling the node nd80 down in response, respectively, to the trigger signal WBI_TRIGP and the predecoded signal PRE_AT<0>, and a second latch 800 for latching a signal at the node nd80.

Figure 9:
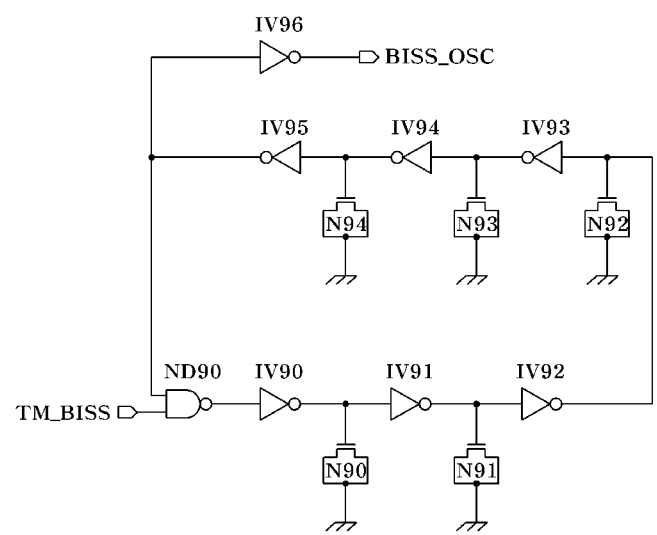
FIG. 9 is a circuit diagram of an oscillator in FIG. 3.

As shown in FIG. 9, the oscillator 30 acts to generate a pulse signal BISS_OSC of a certain period in response to the flag signal TM_BISS. The oscillator 30 is implemented with a general ring oscillator circuit.

Figure 10:
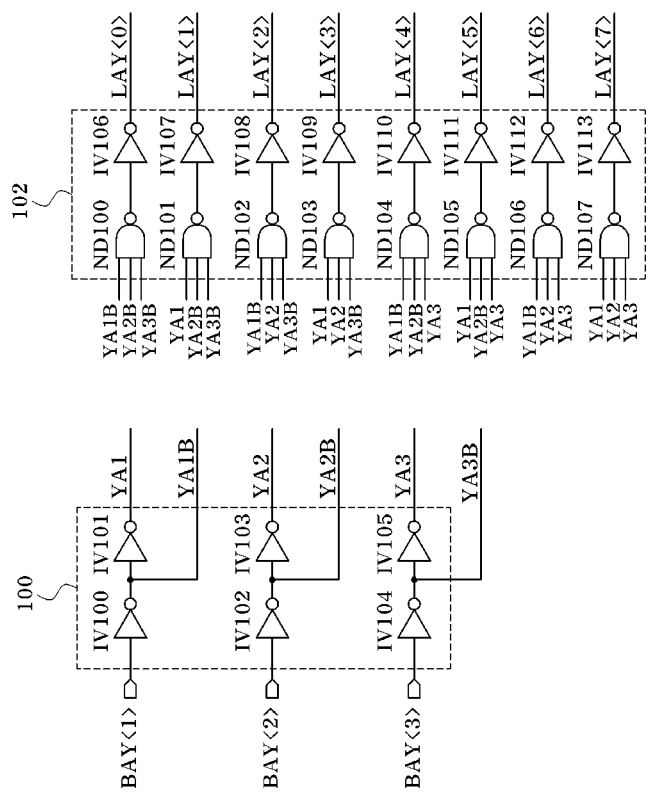
FIG. 10 is a circuit diagram of a second predecoder in FIG. 3.

The second predecoder 33 includes, as shown in FIG. 10, a second control signal generator 100 for buffering the first to third count signals BAY<1:3> to generate respective first to third output control signals YA1, YA2 and YA3 and respective first to third inverted output control signals YA1B, YA2B and YA3B, and a second predecoded signal generator 102 for generating the first to eighth decoded output signals LAY<0:7> in response to the first to third output control signals YA1, YA2 and YA3 and the first to third inverted output control signals YA1B, YA2B and YA3B.

Figure 11:
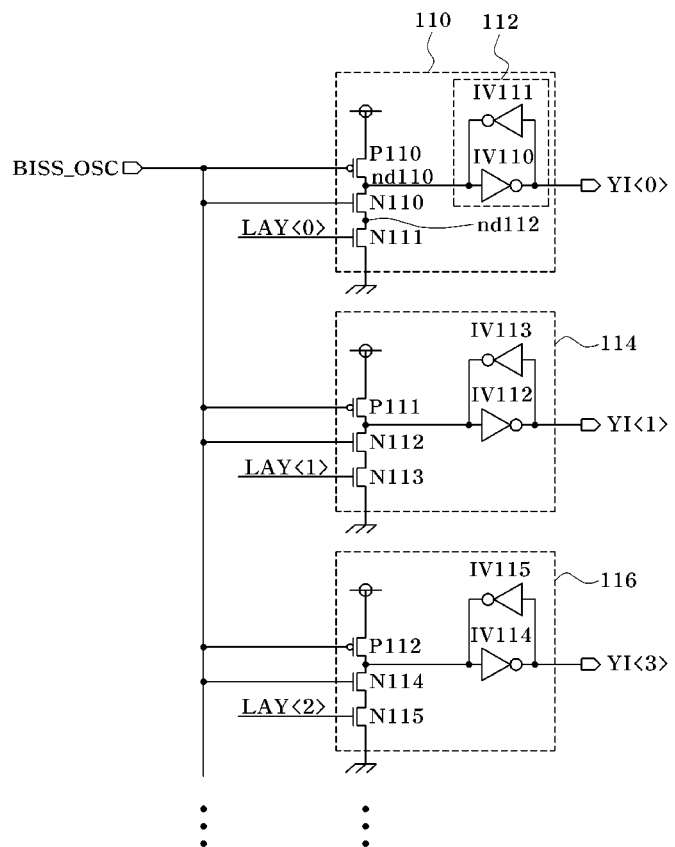
FIG. 11 is a circuit diagram of a second predecoder in FIG. 3.

As shown in FIG. 11, the second decoder 34 acts to generate the first to eighth output enable signals YI<0:7> in response to the first to eighth decoded output signals LAY<0:7>, respectively. In detail, in the second decoder 34, a first output enable signal generator 110, which generates the first output enable signal YI<0>, includes a PMOS transistor P110 for pulling a node nd110 up in response to the pulse signal BISS_OSC, NMOS transistors N110 and N111 connected in series between the node nd110 and the ground voltage terminal VSS for pulling the node nd110 down in response, respectively, to the pulse signal BISS_OSC and the first decoded output signal LAY<0>, and a third latch 112 for latching a signal at the node nd110. Second and third output enable signal generators 114 and 116 which generate the second and third output enable signals YI<1:2>, respectively, and fourth to eighth output enable signal generators (not shown) which generate the fourth to eighth output enable signals YI<3:7>, respectively, are the same in configuration as the first output enable signal generator 110, with the exception that they are operated in response to different decoded output signals LAY<1:7>. Therefore, a detailed description of the configurations of the second to eighth output enable signal generators will be omitted.

Figure 12:
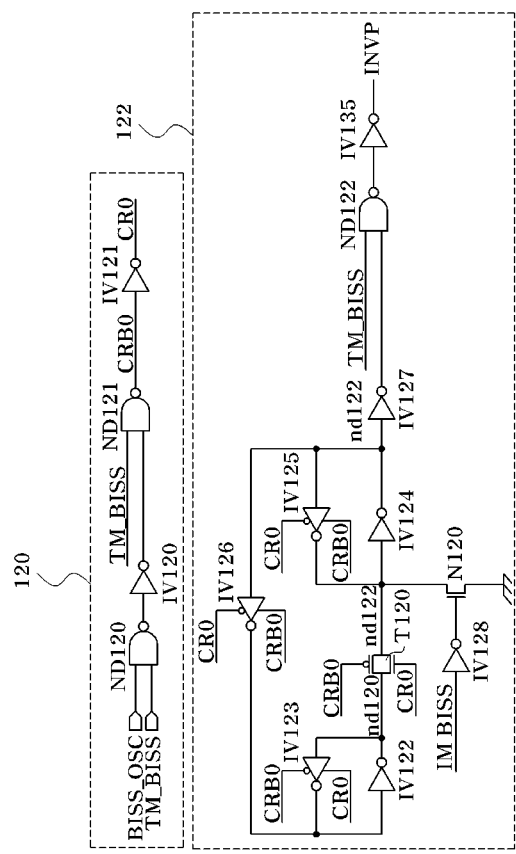
FIG. 12 is a circuit diagram of a demultiply signal generator in FIG. 3.

The demultiply signal generator 36 includes, as shown in FIG. 12, a transfer control signal generator 120 and a demultiplier 122. The transfer control signal generator 120 has a configuration for performing a logic operation with respect to the flag signal TM_BISS and the pulse signal BISS_OSC to generate transfer control signals CR0 and CRB0, each having the same period as that of the pulse signal BISS_OSC. The demultiplier 122 is implemented with a general counter circuit to generate the demultiply signal INVP, which has a period of twice that of the pulse signal BISS_OSC, in response to the transfer control signals CR0 and CRB0.

Figure 13:
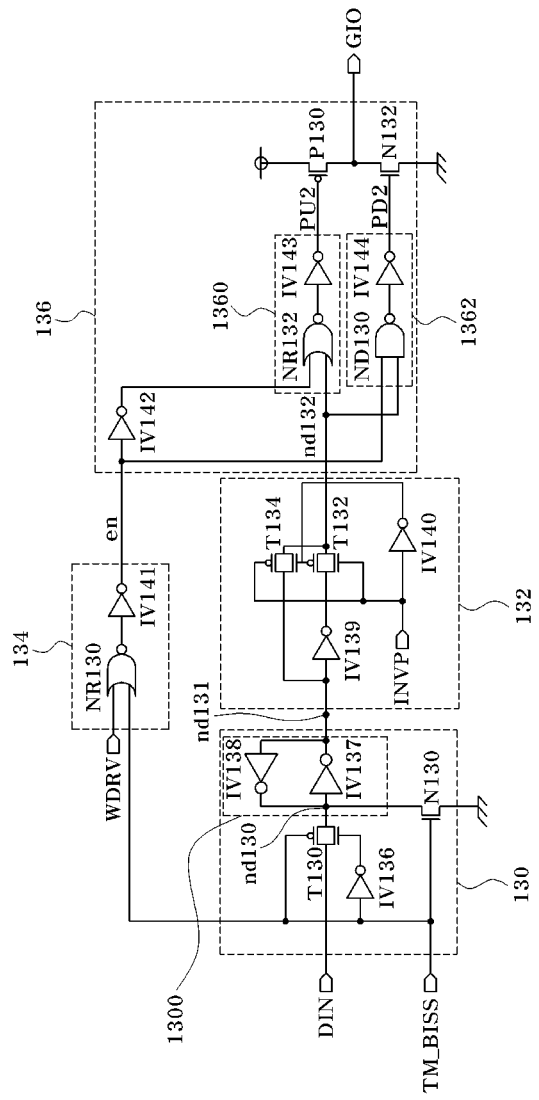
FIG. 13 is a circuit diagram of a data driver in FIG. 3.
Figure 14:
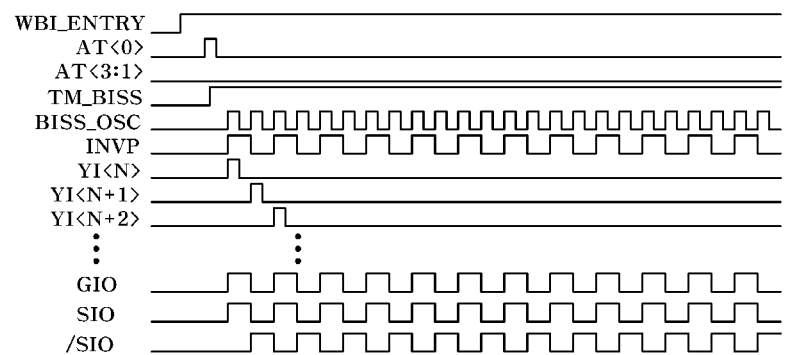
FIG. 14 is a timing diagram illustrating the operation of the burn-in test apparatus of FIG. 1.

As shown in FIG. 13, the data driver 38 acts to load external input data DIN on the global input/output line GIO. To this end, the data driver 38 includes a data input unit 130, a transfer unit 132, an enable signal generator 134, and a driving unit 136. The data input unit 130 includes a transfer gate T130 for blocking the external input data DIN in response to the flag signal TM_BISS, an NMOS transistor N130 for pulling a node nd130 down in response to the flag signal TM_BISS, and a fourth latch 1300 for latching a signal at the node nd130.

The transfer unit 132 includes an inverter IV139 for inverting-buffering a signal at a node nd131, a transfer gate T132 for transferring an output signal from the inverter IV139 to a node nd132 in response to the demultiply signal INVP, and a transfer gate T134 for transferring the signal at the node nd131 to the node nd132 in response to the demultiply signal INVP. The enable signal generator 134 acts to perform an OR operation with respect to the flag signal TM_BISS and a driving signal WDRV to generate an enable signal en. To this end, the enable signal generator 134 includes a NOR gate NR130 and an inverter IV41. The driving signal WDRV assumes a high level in a normal operation and makes a high to low level transition in a burn-in test operation.

The driving unit 136 includes a pull-up signal generator 1360 for performing an OR operation with respect to an inverted signal of the enable signal en and a signal at the node nd132 to generate a second pull-up signal PU2, and a pull-down signal generator 1362 for performing an AND operation with respect to the enable signal en and the signal at the node nd132 to generate a second pull-down signal PD2. The driving unit 136 further includes a PMOS transistor P130 for pulling the global input/output line GIO up in response to the second pull-up signal PU2, and an NMOS transistor N132 for pulling the global input/output line GIO down in response to the second pull-down signal PD2.

The operation of the burn-in test apparatus with the above-stated configuration according to the present embodiment will hereinafter be described with reference to FIGS. 4 to 14.

First, with reference to FIGS. 4 to 8, a description will be given of a process of generating a flag signal TM_BISS by the flag signal generating unit 10.

Referring to FIG. 4, a power-up signal PWRUP becomes high in level after power is normally applied. At this time, if an external input signal WBI of a high level is inputted through a pad (not shown), the input buffer 20 generates an internal signal WBI_ENTRY enabled high in level.

Referring to FIG. 5, the high-level internal signal WBI_ENTRY is inputted to each address buffer 22 to stop the driving of the differential amplifier 52 and drive the bypass circuit 50. Namely, the clock signal generator 54 generates a second clock signal CLK_N of a low level in response to the high-level internal signal WBI_ENTRY, so that an NMOS transistor N55 is turned off, thus stopping the driving of the differential amplifier 52. The high-level internal signal WBI_ENTRY is also inputted to the NAND gate ND50 and NOR gate NR50 of the bypass circuit 50, which thus act as inverters. As a result, first to fourth external address signals ADD<0:3> inputted through the input terminal IN are bypassed to an output terminal out. Consequently, first to fourth internal address signals AT<0:3> outputted through the output terminal out are bypassed versions of the first to fourth external address signals ADD<0:3>, respectively.

The first internal address signal AT<0> is used as a strobe signal for generation of a trigger signal WBI_TRIGP, and the second to fourth internal address signals AT<1:3> are used for generation of first to eighth predecoded signals PRE_AT<0:7>. In the present embodiment, it is assumed that the first external address signal ADD<0> is inputted under the condition of being toggled to a high level and the second to fourth external address signals ADD<1:3> are inputted under the condition that they all are low in level. Accordingly, because the first to fourth internal address signals AT<0:3> generated under the condition that the internal signal WBI_ENTRY is high in level are the bypassed versions of the respective first to fourth external address signals ADD<0:3>, the first internal address signal AT<0> is toggled to a high level and all the second to fourth internal address signals AT<1:3> are low in level.

Referring to FIG. 6, the trigger signal generator 240 generates the trigger signal WBI_TRIGP using the first internal address signal AT<0> as the strobe signal. That is, when the first internal address signal AT<0> is toggled to a high level under the condition that the internal signal WBI_ENTRY is high in level, the second logic circuit 60 outputs a high-level signal in a period in which the first internal address signal AT<0> is high in level. The pulse generator 62 receives this high-level signal and generates the trigger signal WBI_TRIGP. In the present embodiment, the high-level width of the trigger signal WBI_TRIGP is preferably formed to be narrower than that of the first internal address signal AT<0>.

Referring to FIG. 7, the first predecoder 242 decodes the second to fourth internal address signals AT<1:3> to generate the first to eighth predecoded signals PRE_AT<0:7>. In the present embodiment, because the second to fourth internal address signals AT<1:3> are all low in level, only the first predecoded signal PRE_AT<0> is enabled to a high level.

Referring to FIG. 8, the first decoder 244 generates a reset signal RESET using the eighth predecoded signal PRE_AT<7>. Because the eighth predecoded signal PRE_AT<7> is low in level, the reset signal RESET becomes high in level, so as to turn off the PMOS transistors P80, P81 and P82. In the present embodiment, because only the first predecoded signal PRE_AT<0> is enabled high in level, the node nd80 is pulled down to a low level, thereby enabling the flag signal TM_BISS to a high level.

To sum up, when the high-level external input signal WBI is inputted and only the first external address signal ADD<0>, among the first to fourth external address signals ADD<0:3>, is inputted under the condition of being toggled to a high level, the flag signal generating unit 10 of the present embodiment generates the flag signal TM_BISS enabled high in level, to enable a burn-in test mode. On the other hand, when the second to fourth external address signals ADD<1:3> are inputted under the condition of being high in level, the reset signal RESET becomes low in level to make the flag signal TM_BISS low in level, thus disabling the burn-in test mode. The waveform of the internal signal WBI_ENTRY enabled high in level by the high-level external input signal WBI and the waveform of the flag signal TM_BISS enabled high in level when the first internal address signal AT<0> is toggled to a high level can be seen from FIG. 14.

Next, a detailed description will be given of the operation of the burn-in test unit 12 with reference to FIGS. 9 to 13.

Referring to FIG. 9, upon receiving the flag signal TM_BISS enabled high in level, the oscillator 30 generates a pulse signal BISS_OSC of a certain period. At this time, the counter 32 generates first to third count signals BAY<1:3> by performing a counting operation.

Referring to FIG. 10, the second predecoder 33 decodes the first to third count signals BAY<1:3> to generate first to eighth decoded output signals LAY<0:7>. In the present embodiment, the first to third count signals BAY<1:3> generated by the counter 32 and the first to eighth decoded output signals LAY<0:7> generated by the second predecoder 33 have levels as in the following table 1. It can be seen from the table 1 that the first to eighth decoded output signals LAY<0:7> generated by the second predecoder 33 are sequentially enabled.

TABLE 1

| BAY<0> | BAY<1> | BAY<2> | LAY<0> | LAY<1> | LAY<2> | LAY<3> | LAY<4> | LAY<5> | LAY<6> | LAY<7> |
|---|---|---|---|---|---|---|---|---|---|---|
| 0 | 0 | 0 | 1 | 0 | 0 | 0 | 0 | 0 | 0 | 0 |
| 0 | 0 | 1 | 0 | 1 | 0 | 0 | 0 | 0 | 0 | 0 |
| 0 | 1 | 0 | 0 | 0 | 1 | 0 | 0 | 0 | 0 | 0 |
| 0 | 1 | 1 | 0 | 0 | 0 | 1 | 0 | 0 | 0 | 0 |
| 1 | 0 | 0 | 0 | 0 | 0 | 0 | 1 | 0 | 0 | 0 |
| 1 | 0 | 1 | 0 | 0 | 0 | 0 | 0 | 1 | 0 | 0 |
| 1 | 1 | 0 | 0 | 0 | 0 | 0 | 0 | 0 | 1 | 0 |
| 1 | 1 | 1 | 0 | 0 | 0 | 0 | 0 | 0 | 0 | 1 |

Referring to FIG. 11, the second decoder 34 generates first to eighth output enable signals YI<0:7> which are sequentially enabled high in level, respectively, in operative association with the first to eighth decoded output signals LAY<0:7>, respectively which are sequentially enabled high in level.

Referring to FIG. 12, the transfer control signal generator 120 generates a transfer control signal CR0 which is toggled in response to the pulse signal BISS_OSC under the condition that the flag signal TM_BISS is high in level. This transfer control signal CR0 controls enabling of inverters IV123, IV125 and IV126 and a transfer gate T120. That is, the inverter IV123 and transfer gate T120 are enabled when the transfer control signal CR0 is high in level, and the inverters IV125 and IV126 are enabled when the transfer control signal CR0 is low in level. As a result, a signal at a node nd120 is inverted when the transfer control signal CR0 is high in level, and maintained at the same level when the transfer control signal CR0 is low in level, so that the demultiply signal INVP generated by the demultiplier 122 becomes a ÷2 signal of the pulse signal BISS_OSC.

Referring to FIG. 13, in the data driver 38, when the flag signal TM_BISS is high in level, the transfer gate T130 is turned off to block the data DIN input, and the enable signal en and the signal at the node nd130 become high in level. Because the transfer gate T132 and the transfer gate T134 are selectively turned on by the demultiply signal INVP, the signal at the node nd130 and the inverted signal thereof are sequentially inputted to the driving unit 136. At this time, because a NAND gate ND130 and a NOR gate NR132 act as inverters by the high-level enable signal en, both the second pull-up signal PU2 and second pull-down signal PD2 become high or low in level depending on the signal at the node nd130 and the inverted signal thereof. Consequently, data on the global input/output line GIO is pulled up or down according to the demultiply signal INVP.

To sum up, the burn-in test unit 12 of the present embodiment receives the flag signal TM_BISS enabled high in level and generates the first to eighth output enable signals YI<0:7> toggled in order, and toggles data on the global input/output line GIO. The waveform of the pulse signal BISS_OSC generated when the flag signal TM_BISS enabled high in level is inputted and the waveform of the demultiply signal INVP which is a ÷2 signal of the pulse signal BISS_OSC can be seen from FIG. 14. Also, the waveforms of the first to eighth output enable signals YI<0:7> sequentially enabled in response to the flag signal TM_BISS and the pulse signal BISS_OSC and the waveform of the data on the global input/output line GIO toggled in response to the flag signal TM_BISS and the demultiply signal INVP can be seen from FIG. 14.

Figure 15:
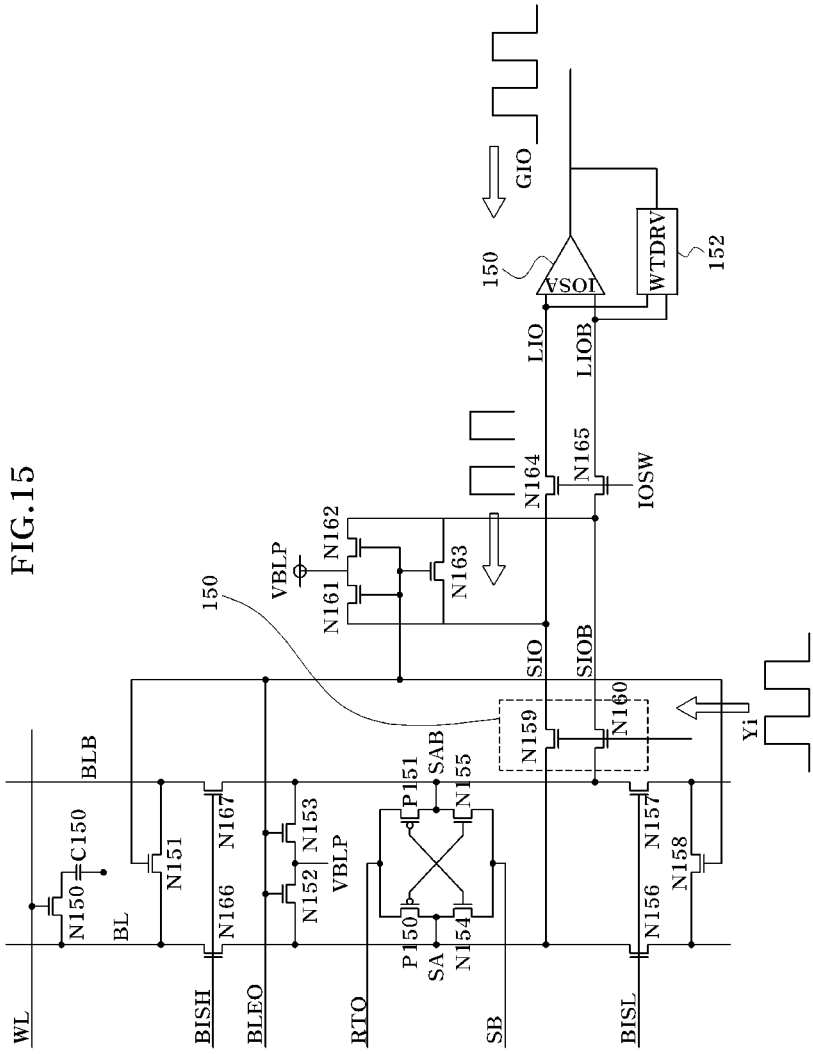
FIG. 15 is a circuit diagram of a semiconductor device which is driven by a test signal generated by the burn-in test apparatus, according to another exemplary embodiment of the present disclosure.

The above-described burn-in test apparatus of the present embodiment is applicable to a semiconductor device to screen a contact defect of an output switch 150. That is, as shown in FIG. 15, stress can be applied to a gate contact of the output switch 150 by applying the toggled output enable signal Yi generated by the burn-in test apparatus of the present embodiment to the gate contact. In addition, stress may be applied to a drain/source contact of the output switch 150 by toggling data placed on a global input/output line GIO through the burn-in test apparatus of the present embodiment. By applying stresses to the contacts of the output switch 150 in this manner, it is possible to screen and improve a contact defect of the output switch 150 in advance so as to increase reliability of the device.

Although examples and preferred embodiments of the present invention have been disclosed for illustrative purposes, those skilled in the art will appreciate that various modifications, additions and substitutions are possible, without departing from the scope and spirit of the disclosure and the accompanying claims.

The present application is based on and claims priority to Korean patent application number 10-2007-0049357, filed on May 21, 2007, which is incorporated herein by reference in its entirety.

What is claimed is:

1. A semiconductor device comprising:
    a burn-in test circuit configured to receive a flag signal for a burn-in test, generate a toggled output enable signal, and drive a first input/output line to toggle a signal on the first input/output line;
    a switching device connected between a bit line and a second input/output line for transferring a signal on the bit line to the second input/output line in response to the output enable signal; and
    a flag signal generating unit configured to receive an external input signal and an external address externally inputted for a burn-in test and generate the flag signal.

2. The semiconductor device according to claim 1, wherein the flag signal generating unit comprises:
    an input buffer for buffering the external input signal and generating an internal signal;
    an address buffer for buffering the external address in response to the internal signal and generating an internal address; and
    a signal generator configured to receive the internal signal and the internal address and generate the flag signal.

3. The semiconductor device according to claim 1, wherein the burn-in test circuit comprises:
   an oscillator for generating a pulse signal in response to the flag signal;
   an output enable signal generator for generating the output enable signal in response to the pulse signal; and
   an input/output line driver for driving the first input/output line in response to the pulse signal.

4. The semiconductor device according to claim 2, wherein the input buffer comprises a logic circuit for performing a logic operation with respect to a power-up signal and the external input signal, to generate the internal signal.

5. The semiconductor device according to claim 2, wherein the address buffer comprises a bypass circuit, a differential amplifier, a clock signal generator and a latch, the bypass circuit for transferring the external address as the internal address in response to the internal signal.

6. The semiconductor device according to claim 2, wherein the signal generator comprises a decoder for decoding the internal address, to generate the flag signal.

7. The semiconductor device according to claim 2, wherein the signal generator comprises:
   a trigger signal generator for generating a trigger signal in response to the internal signal and a first address signal;
   a predecoder configured to receive a second address signal and generate a predecoded signal; and
   a decoder for generating the flag signal in response to the trigger signal and the predecoded signal,
   wherein the first and second address signals are included in the internal address.

8. The semiconductor device according to claim 5, wherein the bypass circuit comprises:
   a first logic device for performing a first logic operation with respect to the internal signal and the external address, to generate a pull-up signal;
   a second logic device for performing a second logic operation with respect to the internal signal and the external address, to generate a pull-down signal; and
   a buffer circuit including a pull-up device for pulling an output node up in response to the pull-up signal, and a pull-down device for pulling the output node down in response to the pull-down signal.

9. The semiconductor device according to claim 5, wherein the clock signal generator performs a logic operation with respect to a first clock signal and the internal signal to generate a second clock signal.

10. The semiconductor device according to claim 7, wherein the trigger signal generator comprises:
    a logic circuit for performing a logic operation with respect to the internal signal and the first address signal; and
    a pulse generator for generating the trigger signal in response to an output signal from the logic circuit.

11. The semiconductor device according to claim 7, wherein the decoder comprises first and second pull-down devices connected in series between an output node and a ground voltage terminal for pulling the output node down, the first pull-down device is an n-channel metal oxide semiconductor (NMOS) transistor configured to turn on in response to the trigger signal, and the second pull-down device is an NMOS transistor configured to turn on in response to the predecoded signal.

12. The semiconductor device according to claim 11, wherein the output enable signal generator comprises:
    a counter for generating a count signal in response to the pulse signal;
    a predecoder for predecoding the count signal to generate a predecoded signal; and
    a decoder configured to receive the pulse signal and the predecoded signal and generate the output enable signal.

13. The semiconductor device according to claim 11, wherein the input/output line driver comprises:
    a demultiply signal generator configured to receive the pulse signal and generate a demultiply signal in response to the flag signal, the demultiply signal being a demultiplied signal of the pulse signal; and
    a data driver for driving the input/output line in response to the flag signal and the demultiply signal.

14. The semiconductor device according to claim 12, wherein the decoder comprises first and second pull-down devices connected in series between an output node and a ground voltage terminal for pulling the output node down,
    wherein the first pull-down device is turned on in response to the pulse signal, and the second pull-down device is turned on in response to the predecoded signal.

15. The semiconductor device according to claim 13, wherein the data driver comprises:
    a data input unit comprising a transfer gate for transferring an external input data to a first node in response to the flag signal, a pull-down device for pulling the first node down in response to the flag signal and a latch for latching a signal at the first node,
    a transfer unit for selectively transferring a signal from the latch or an inverted signal of the signal from the latch in response to the demultiply signal; and
    a driving unit configured to receive an output signal from the transfer unit and generate a pull-up signal and a pull-down signal in response to the enable signal to drive the input/output line.

\* \* \* \* \*